United States Patent
Koo

(10) Patent No.: US 10,322,434 B2
(45) Date of Patent: Jun. 18, 2019

(54) HEAT-INSULATING SHEET AND METHOD FOR MANUFACTURING SAME

(71) Applicant: AMOGREENTECH CO., LTD., Gimpo-si (KR)

(72) Inventor: Song Hee Koo, Seoul (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 15/101,611

(22) PCT Filed: Dec. 30, 2014

(86) PCT No.: PCT/KR2014/013046
§ 371 (c)(1),
(2) Date: Jun. 3, 2016

(87) PCT Pub. No.: WO2015/102376
PCT Pub. Date: Jul. 9, 2015

(65) Prior Publication Data
US 2017/0028431 A1     Feb. 2, 2017

(30) Foreign Application Priority Data
Dec. 30, 2013 (KR) .......... 10-2013-0167172

(51) Int. Cl.
*B32B 7/02* (2019.01)
*B05D 1/02* (2006.01)
(Continued)

(52) U.S. Cl.
CPC .......... *B05D 1/02* (2013.01); *B05D 1/18* (2013.01); *B05D 7/22* (2013.01); *H05K 5/0213* (2013.01);
(Continued)

(58) Field of Classification Search
CPC ... B05D 1/02; B05D 1/18; B05D 7/22; H05K 5/0213
See application file for complete search history.

(56) References Cited

U.S. PATENT DOCUMENTS 3,707,433 A * 12/1972 Clough et al. .......... B29C 44/12
428/137
4,054,710 A * 10/1977 Botsolas ................. B29C 70/00
428/317.7
(Continued)

FOREIGN PATENT DOCUMENTS

JP      2001090220      4/2001
JP      2011042723      3/2011
(Continued)

OTHER PUBLICATIONS

International Search Report—PCT/KR2014/013046 dated Feb. 27, 2015.

*Primary Examiner* — Lawrence D Ferguson
(74) *Attorney, Agent, or Firm* — Cantor Colburn LLP

(57) ABSTRACT

Provided are a heat insulation sheet and a method for manufacturing the same. The heat insulation sheet includes: a nonwoven fabric having a plurality of pores; and first and second coating films which are coated on both sides of the nonwoven fabric and made of a polymer material, wherein the plurality of pores are implemented as air pockets for thermal capture by the first and second coating films.

8 Claims, 4 Drawing Sheets

(51) Int. Cl.
*H05K 5/02* (2006.01)
*B05D 1/18* (2006.01)
*B05D 7/22* (2006.01)

(52) U.S. Cl.
CPC ...... *B05D 2201/00* (2013.01); *B05D 2252/10* (2013.01)

(56) References Cited

U.S. PATENT DOCUMENTS

| | | | | |
|---|---|---|---|---|
| 4,636,331 | A | * | 1/1987 | Sako ................. B32B 27/18 252/511 |
| 6,074,963 | A | * | 6/2000 | Okami ................. C08J 5/04 442/16 |
| 2009/0011188 | A1 | * | 1/2009 | Yasumitsu ............ A47L 13/16 428/138 |
| 2012/0100337 | A1 | * | 4/2012 | Suzuki ................ B60R 13/013 428/116 |

FOREIGN PATENT DOCUMENTS

| | | |
|---|---|---|
| KR | 20090115391 | 11/2009 |
| KR | 101034456 | 5/2011 |
| KR | 20120036574 | 4/2012 |
| KR | 20130088922 | 8/2013 |

* cited by examiner

HEAT-INSULATING SHEET AND METHOD FOR MANUFACTURING SAME

TECHNICAL FIELD

The present invention relates to a heat insulation sheet, and more particularly to, a heat insulation sheet which can increase the adhesive strength, improve the peel strength, and maximize the heat insulation capability in an ultra-thin structure, and a method of manufacturing the same.

BACKGROUND ART

Generally, if electronic products such as computers, displays, and mobile terminals do not adequately diffuse heat generated from the inside of the electronic products to the outside thereof, a collision with the residual images on a screen, the failure of the system, etc., may be caused due to excessive accumulation of the heat generated. In addition, due to the excessive accumulation of the heat, the life of the electronic products may be shortened or the source of the explosion and fire may be also provided in severe cases.

In recent years, electronic products including mobile terminals are continuously evolving, and are promoting high performance and multi-function according to user's needs.

In particular, mobile terminals are required to be compact in size and light in weight to maximize the user's portability and convenience, and integrated components are being mounted in a small space for the high-performance. Accordingly, components used in mobile terminals become increasingly high performance to thus increase heating temperature. The increased heating temperature makes an influence upon adjacent components to thus cause the performance of the mobile terminals to be lowered.

A variety of insulating materials are applied in mobile terminals in order to solve problems due to heat generated from the mobile terminals, but optimum insulation materials that are thin and has excellent heat insulation performance have not been developed yet. Thus, a technology of insulation is variously under research and development.

Korean Patent Application Publication No. 2012-0036574 disclosed a complex sheet structure using heat insulation nonwoven fabric including: a nonwoven sheet layer which performs a heat insulation function; an inorganic coating waterproofing layer which is coated on the nonwoven sheet layer and performs a main waterproofing function and an adhesive function; a glass fiber layer one surface of which is bonded and laminated on the inorganic coating waterproofing layer; a solventless urethane waterproofing agent layer which is coated on the glass fiber layer and performs a waterproofing function; and an acrylic resin-based coating agent layer which is coated on the solventless urethane waterproofing agent layer, to thereby provide advantages of improving the durability of the structure and preventing the deformation and the damage of the structure due to external conditions such as heat and impact. However, since the composite sheet structure is configured to form the inorganic coating waterproofing layer only on one surface of the nonwoven fabric sheet layer of performing the heat insulation function, pores of the nonwoven fabric sheet layer are exposed to the outside to thus cause a problem of reducing the heat insulation capability in the nonwoven fabric sheet layer.

Thus, the present inventors have continuously studied a technology of making an excellent heat insulation function with an ultra-thin structure to thereby form a coating film made of a polymeric material on both sides of a nonwoven fabric to thus have derived and invented structural features of a sheet which ensures thickness uniformity, maximizes heat insulation efficiency, and ultra-thins the structure, and to thus have completed a heat insulation sheet according to the present invention, which is more economical, utilizable, and competitive.

DISCLOSURE

Technical Problem

To solve the above problems or defects, it is an object of the present invention to provide a heat insulation sheet which improves the peel strength by increasing the adhesive strength of the insulation sheet, and a method of manufacturing the same.

It is another object of the present invention to provide a heat insulation sheet that can maximize the heat insulation capability in an ultra-thin sheet, and a method of manufacturing the same.

It is still another object of the present invention to provide a heat insulation sheet that can improve the thickness uniformity of the heat insulation sheet including a nonwoven fabric, and a method of manufacturing the same.

Technical Solution

To accomplish the above and other objects of the present invention, according to an aspect of the present invention, there is provided a heat insulation sheet comprising: a nonwoven fabric having a plurality of pores; and first and second coating films which are coated on both sides of the nonwoven fabric and made of a polymer material, wherein the plurality of pores are implemented as air pockets for thermal capture by the first and second coating films.

To accomplish the above and other objects of the present invention, according to another aspect of the present invention, there is provided a method of manufacturing a heat insulation sheet, the method comprising the steps of: preparing a nonwoven fabric having a plurality of pores; forming first and second coating films made of a polymer material on both sides of the nonwoven fabric, thereby forming the plurality of pores as air pockets for thermal capture; and drying the nonwoven fabric on which the first and second coating films have been formed.

Advantageous Effects

As described above, according to the present invention, it is possible to implement a heat insulation sheet by forming first and second coating films on a nonwoven fabric with a polymer material of an excellent binding capability, to thus increase the adhesive strength and improve the peel strength.

The heat insulation sheet according to the present invention has an advantage that can maximize a heat insulation capability with a nonwoven fabric having air pockets for thermal capture and first and second coating films made of a polymer material with a low thermal conductivity.

The heat insulation sheet according to the present invention has an effect that it is possible to improve the thickness uniformity of the heat insulation sheet containing a nonwoven fabric by forming coating films on both surfaces of the nonwoven fabric having a coarse surface roughness.

The heat insulation sheet according to the present invention may improve the heat insulating performance by preventing the heat transfer due to the water since the coating films coated on the nonwoven fabric are made of a fluorine-based polymer material.

The heat insulation sheet according to the present invention may suppress convection of heat and thus increase the heat insulating efficiency, by forming air pockets for the thermal capture, since the coating films are formed on the inner walls of pores in the nonwoven fabric, to thereby reduce the size of the pores.

The heat insulation sheet according to the present invention is manufactured by including a nonwoven fabric and coating films formed on both sides of the nonwoven fabric, to thus provide a technique that can implement an ultra-thin sheet.

The heat insulation sheet according to the present invention has advantages of implementing a laminated sheet having a variety of functions as well as a heat insulation function, by bonding a sheet on coating films of a nonwoven fabric, the sheet performing a homogeneous function such as heat insulation or a heterogeneous function such as heat radiation and electromagnetic shield.

The heat insulation sheet according to the present invention has excellent insulation performance with an ultra-thin structure to thus provide an effect that can be applied to a high-performance electronic device including mobile terminals.

BEST MODE

Figure 1:
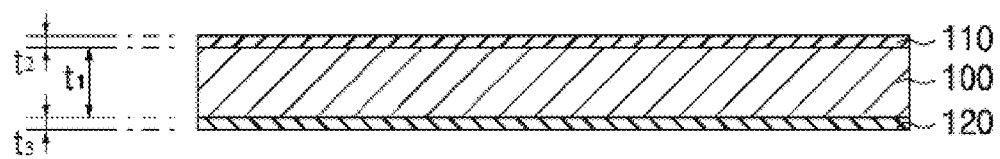
FIG. 1 is a schematic cross-sectional view of a heat insulation sheet according to a first embodiment of the present invention.

The terms used in the specification and claims, are not usually to be limited and interpreted to the dictionary meanings, or must be interpreted into the meanings and concepts corresponding to technical aspects of the present invention on the basis of the principle that the inventor(s) can properly define the concept of terms to describe his or her (their) own invention in the best way.

Accordingly, the embodiment described in the specification and the configuration shown in the drawings are merely nothing but preferable embodiments of the present invention, not intended to represent all the technical sprits and scopes of the present invention, and thus it should be understood that a variety of equivalents and modifications may exist so as to replace them in the point in time of filing the present application.

Hereinafter, a heat insulation sheet and a method of manufacturing the same according to embodiments of the present invention will be described with reference to the accompanying drawings. In the process, the sizes and shapes of components illustrated in the drawings may be shown exaggerated for convenience and clarity of explanation. Further, by considering the configuration and operation of the present invention, the specifically defined terms may be changed according to user's or operator's intention, or the custom. Definitions of these terms herein need to be made based on the contents across the whole application.

Referring to FIG. 1, a heat insulation sheet according to a first embodiment of the present invention includes: a nonwoven fabric 100 having a plurality of pores and first and second coating films 110 and 120 which are coated on both sides of the nonwoven fabric 100 and made of a polymer material.

Here, the plurality of pores in the nonwoven fabric 100 are implemented as air pockets for thermal capture by the first and second coating films 110 and 120. That is, the first and second coating films 110 and 120 perform a function of forming the plurality of pores in the nonwoven fabric 100 into the air pockets for thermal capture, and a function of improving the peel strength.

In other words, before the first and second coating films 110 and 120 are formed, the plurality of pores formed in the nonwoven fabric 100 are an open pore structure state which is open to the outer surface of the nonwoven fabric 100, but after the first and second coating films 110 and 120 are formed, the plurality of pores formed in the nonwoven fabric 100 are a close pore structure state which is blocked by the first and second coating films 110 and 120. Accordingly, the plurality of pores perform a function of air pockets for thermal capture in the heat insulation sheet.

Therefore, the heat insulation sheet according to the first embodiment of the present invention is provided with the air pockets for thermal capture inside the nonwoven fabric 100 to thus improve the heat insulating efficiency.

In addition, the first and second coating films 110 and 120 perform an adhesive strengthening function. In other words, when other sheets are bonded on the nonwoven fabric 100, the adhesive force is weakened by open pores of the nonwoven fabric 100 to thus easily cause a peel-off phenomenon. In some embodiments of the present invention, the pores in the nonwoven fabric 100 are blocked by the first and second coating films 110 and 120, and the first and second coating films 110 and 120 are formed by using a polymer material of an excellent binding capability, to thus increase the adhesive strength and improve the peel strength.

In addition, a polymer material of low thermal conductivity is applied for the polymer material forming the first and second coating films 110 and 120, to thus enable the first and second coating films 110 and 120 to have a reinforced heat insulation function, and to thereby further improve a heat shield efficiency of the heat insulation sheet according to an embodiment of the present invention.

As shown in FIG. 1, when the nonwoven fabric 100 has a predetermined thickness $t_1$, the thicknesses $t_2$ and $t_3$ of the first and second coating films 110 and 120 are preferably thinner than the thickness $t_1$ of the nonwoven fabric 100.

Meanwhile, after the nonwoven fabric 100 is manufactured, the surface of the nonwoven fabric 100 is not flat, and has a coarse surface roughness. The above-mentioned first and second coating films 110 and 120 are coated on the surfaces of the nonwoven fabric 100 having a coarse surface roughness to thus serve to flatten the surface of the heat insulation sheet. In addition, it is possible to ensure the thickness uniformity of the heat insulation sheet.

The nonwoven fabric may be made of one fiber of PP, PE, and polyethylene terephthalate (PET), or made of a PP/PE fiber of a double structure in which PE is coated on an outer periphery of a PP fiber as a core.

Then, a polymer material with a binding capability is used as the polymer material forming the first and second coating films 110 and 120. It is preferable in particular to use a fluorine-based polymer material as the polymer material forming the first and second coating films 110 and 120.

The fluorine-based polymer material is a water-repellent polymer that prevents absorbing of moisture, to thus enhance the heat insulating performance by preventing the heat transfer due to the water.

Furthermore, in some embodiments of the present invention, it is preferable to use a polymer material of low thermal conductivity, in which the polymer material of low thermal conductivity may be one of polyurethane (PU), polystyrene, polyvinyl chloride, cellulose acetate, polyvinylidene fluoride (PVDF), polyacrylonitrile nitrile (PAN), polymethyl methacrylate, polyvinyl acetate, polyvinyl alcohol, polyimide, and polytetrafluoroethylene (PTFE).

Here, the thermal conductivity of the polymer is preferably set to less than 0.1 W/m·K.

Since it is known that the polyurethane (PU) of the polymer materials has thermal conductivity of 0.016~0.040 W/m·K and the polystylene (PS) and the polyvinyl chloride have thermal conductivity of 0.033~0.040 W/m·K, the coating films formed by using the polyurethane (PU) and the polystylene (PS) and the polyvinyl chloride have also low thermal conductivity.

The heat insulation sheet in accordance with an embodiment of the present invention is configured to include the nonwoven fabric and the coating films made of the polymer material, in which air pockets for thermal capture are formed in the nonwoven fabric, to improve the heat insulating efficiency, and improve the peel strength.

In addition, a polymer material of low thermal conductivity is used as the coating films formed on the nonwoven fabric, to thus provide an advantage of maximizing the heat insulation capability of the heat insulation sheet.

Figure 2:
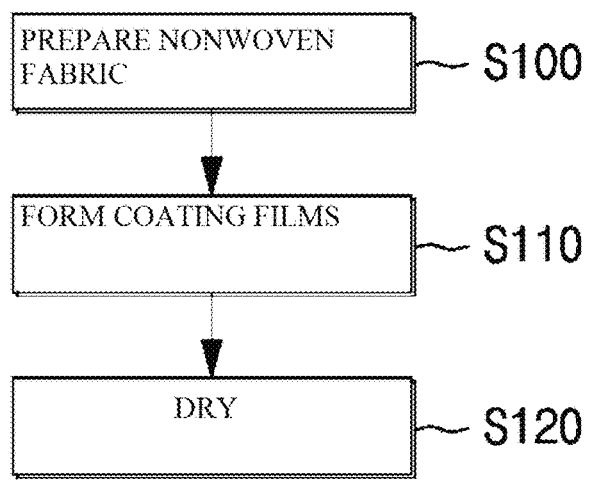
FIG. 2 is a flow chart of a method of manufacturing a heat insulation sheet according to the first embodiment of the present invention.

Referring to FIG. 2, a method of manufacturing the heat insulation sheet according to the first embodiment of the present invention, includes a step of preparing a nonwoven fabric having a plurality of pores (S100).

Then, first and second coating films made of a polymer material are formed on both sides of the nonwoven fabric, to thus form the plurality of pores into air pockets for thermal capture (S110).

Here, the process of forming the first and second coating films made of the polymer material on both sides of the nonwoven fabric, preferably employs a method of coating a coating solution on both sides of the nonwoven fabric, such as a coating method of using any one of dip coating, knife coating, roll coating, cast coating, and spray coating which dips the nonwoven fabric in a bath (container) containing the coating solution including the polymer material to then be coated. Here, the amount of the coating solution coated on the nonwoven fabric is determined by time conditions for dipping.

Figure 3A:
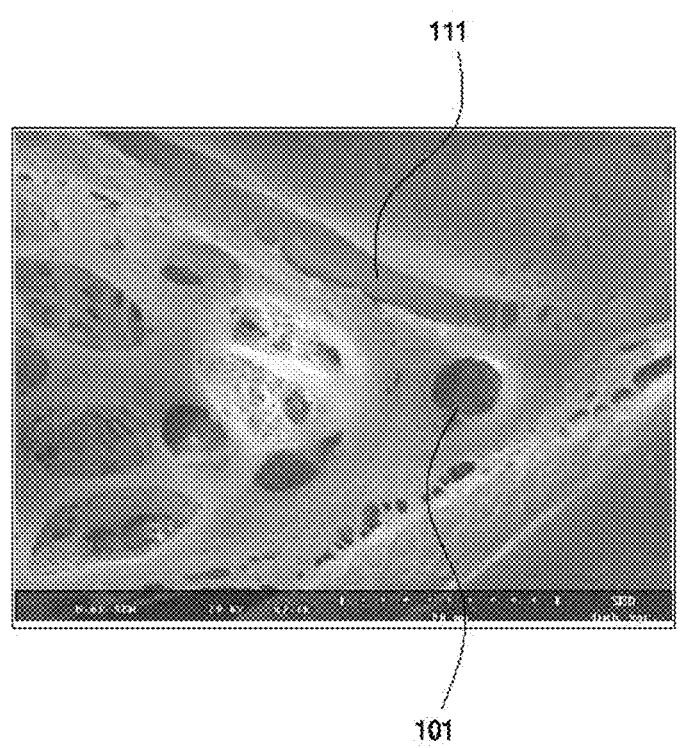
FIGS. 3A and 3B are photographs showing the state that a coating film of a polymer material is formed on a nonwoven material according to the first embodiment of the present invention.
Figure 3B:
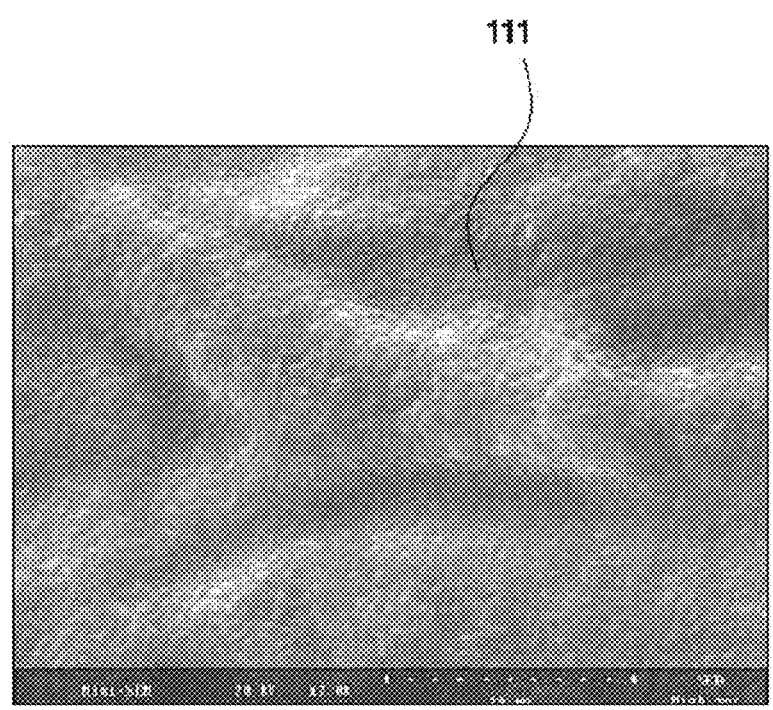

That is, according to the time for dipping the nonwoven fabric in the bath containing the coating solution, some pores 101 of the nonwoven fabric may be even exposed to the surface of a coating film 111 as shown in FIG. 3A, and the coating film 111 may completely block the entrance of the pores of the nonwoven fabric, as shown in FIG. 3B.

Figure 4:
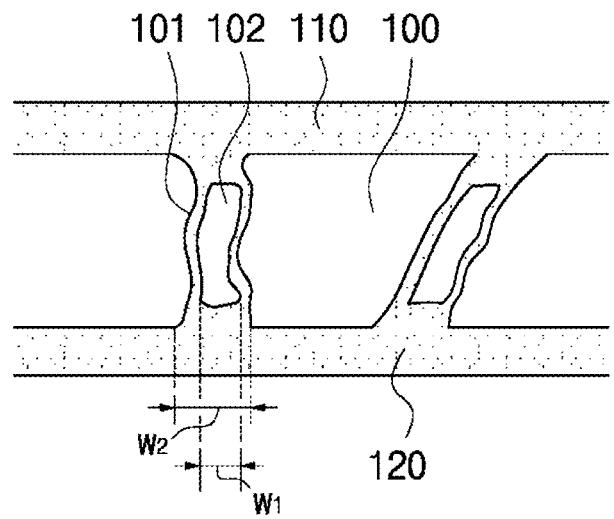
FIG. 4 is a conceptual partial cross-sectional view showing a state that some micro-pockets for thermal capture are formed in a heat insulation sheet according to the first embodiment of the present invention.

Here, as shown in FIG. 4, the coating solution is coated on both sides of the nonwoven fabric 100 to thus form the first and second coating films 110 and 120 made of the polymer material. Then, the coating solution is penetrated into the entrance of the pores 101 that are exposed on both surfaces of the nonwoven fabric 100, to then be coated on the inner walls of the pores 101.

Here, the coating solution may not completely block the pores 101, and thus the pores 101 become the air pockets 102 for thermal capture in the nonwoven fabric 100 and the coating solution is coated on the inner walls of the pores 101. Thus, the widths $w_2$ of the air pockets 102 for thermal capture are smaller than the widths $w_1$ of the pores 101. Therefore, it is possible to suppress the convection of heat from the inside of the air pockets 102 for the thermal capture, to thereby improve the heat insulation efficiency.

In some embodiments of the present invention, an available polymer material is dissolved in a solvent to prepare an impregnation solution (that is, a coating solution), to put the impregnation solution into a bath, and then impregnating the nonwoven fabric 100, to thereby form the first and second coating films 110 and 120.

The solvent may employ at least one selected from the group consisting of is DMA (dimethyl acetamide), DMF (N, N-dimethylformamide), DMAc (di-methylacetamide), IPA (isopropyl alcohol), NMP (N-methyl-2-pyrrolidinone), DMSO (dimethyl sulfoxide), THF (tetra-hydrofuran), EC (ethylene carbonate), DEC (diethyl carbonate), DMC (dimethyl carbonate), EMC (ethyl methyl carbonate), PC (propylene carbonate), water, acetic acid, and acetone.

Then, the nonwoven fabric on which the first and second coating films have been formed are dried at room temperature (S120).

Here, it is preferable to dry the nonwoven fabric on which the first and second coating films have been formed after putting the nonwoven fabric on an absorption sheet which can absorb the solvent. The absorption sheet can absorb the solvent of the coating solution to thus reduce the drying time. The absorption sheet may employ an imitation vellum paper or a release paper.

Figure 5:
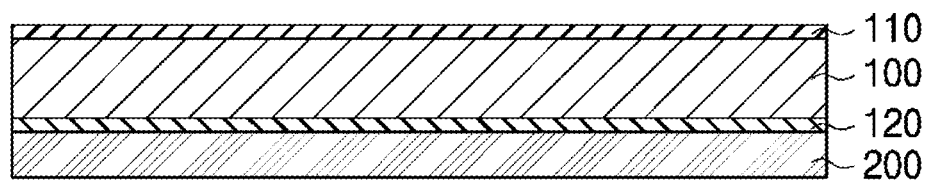
FIG. 5 is a schematic sectional view illustrating a heat insulation sheet according to a second embodiment of the present invention.
Figure 6:
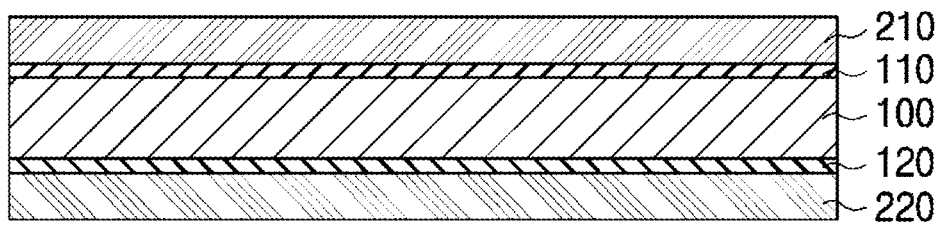
FIG. 6 is a schematic cross-sectional view illustrating a heat insulation sheet according to a third embodiment of the present invention.

FIG. 5 is a schematic sectional view illustrating a heat insulation sheet according to a second embodiment of the present invention, and FIG. 6 is a schematic cross-sectional view illustrating a heat insulation sheet according to a third embodiment of the present invention.

The heat insulation sheet according to the second embodiment of the present invention is implemented by bonding another functional sheet 200 in one or both of the first and second coating films 110 and 120, as shown in FIG. 5. The heat insulation sheet according to the third embodiment of the present invention is implemented by bonding other functional sheets 210 and 220 in one or both of the first and second coating films 110 and 120, as shown in FIG. 6.

The heat insulation sheet according to the present invention has advantages of implementing a laminated sheet having a variety of functions as well as a heat insulation function, by bonding a sheet on coating films 110 and 120, the sheet performing a homogeneous function such as heat insulation or a heterogeneous function such as heat radiation and electromagnetic shield.

That is, in FIG. 5, one functional sheet 200 is bonded to the second coating film 120, and in FIG. 6, functional sheets 210 and 220 are bonded on the first and second coating films 110 and 120, respectively.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention may be applied to a heat insulation sheet which improves the peel strength by increasing the adhesive strength of the heat insulation sheet.

The invention claimed is:

1. A heat insulation sheet comprising:
a nonwoven fabric having a plurality of pores; and
a first coating film coated directly on one side of the non-woven fabric and a second coating film coated directly on the other side of the nonwoven fabric, and the first coating film and the second coating film being made of a polymer material, wherein the polymer material of the first and second coating films is coated on inner walls of the pores of the nonwoven fabric and closes exposed pores in surfaces of the nonwoven fabric to form a plurality of air pockets inside the nonwoven fabric for thermal capture, and wherein the air pockets have a size smaller than that of the pores.

2. The heat insulation sheet of claim 1, wherein the polymer material is a fluorine-based polymer.

3. The heat insulation sheet of claim 1, wherein the polymer material is one selected from the group consisting of polyurethane (PU), polystyrene, polyvinyl chloride, cellulose acetate, polyvinylidene fluoride (PVDF), polyacrylonitrile (PAN), polymethyl methacrylate, polyvinyl acetate, polyvinyl alcohol, polyimide, and polytetrafluoroethylene (PTFE).

4. The heat insulation sheet of claim 1, wherein the nonwoven fabric is made of one fiber of PP, PE, and polyethylene terephthalate (PET), or made of a PP/PE fiber of a double structure in which PE is coated on an outer periphery of a PP fiber as a core.

5. The heat insulation sheet of claim 1, wherein the first and second coating films have a thickness thinner than that of the nonwoven fabric.

6. The heat insulation sheet of claim 1, further comprising: a functional sheet bonded on one or both of the first and second coating films, the functional sheet performing at least one of a heat insulation function, a heat radiation function, and an electromagnetic shield function.

7. The heat insulation sheet of claim 1, wherein inner walls of the plurality of pores are coated by part of the first and the second coating films.

8. The heat insulation sheet of claim 1, wherein the widths of the air pockets for the thermal capture are smaller than the widths of the pores.

* * * * *